(12) United States Patent
Lin et al.

(10) Patent No.: US 8,592,311 B2
(45) Date of Patent: *Nov. 26, 2013

(54) SEMICONDUCTOR DEVICE AND METHOD FOR FORMING PASSIVE CIRCUIT ELEMENTS WITH THROUGH SILICON VIAS TO BACKSIDE INTERCONNECT STRUCTURES

(75) Inventors: Yaojian Lin, Singapore (SG); Haijing Cao, Singapore (SG); Qing Zhang, Singapore (SG); Kang Chen, Singapore (SG); Jianmin Fang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/615,308

(22) Filed: Sep. 13, 2012

(65) Prior Publication Data
US 2013/0015554 A1    Jan. 17, 2013

Related U.S. Application Data

(60) Continuation of application No. 12/704,366, filed on Feb. 11, 2010, now Pat. No. 8,310,058, which is a division of application No. 11/947,617, filed on Nov. 29, 2007, now Pat. No. 7,691,747.

(51) Int. Cl.
*H01L 21/44* (2006.01)

(52) U.S. Cl.
USPC .................. 438/667; 257/698; 257/E21.597

(58) Field of Classification Search
USPC .................. 438/108, 112, 459, 667; 257/698, 257/E21.597, E21.627, E21.641
See application file for complete search history.

(56) References Cited

U.S. PATENT DOCUMENTS

| 6,495,912 | B1 | 12/2002 | Huang et al. | |
| 6,636,139 | B2 * | 10/2003 | Tsai et al. | 336/200 |
| 6,800,930 | B2 * | 10/2004 | Jackson et al. | 257/700 |
| 6,911,392 | B2 | 6/2005 | Bieck et al. | |
| 6,916,725 | B2 * | 7/2005 | Yamaguchi | 438/459 |
| 7,208,832 | B2 | 4/2007 | Yamagata | |
| 7,553,765 | B2 | 6/2009 | Komuro et al. | |
| 7,691,747 | B2 * | 4/2010 | Lin et al. | 438/667 |
| 8,168,470 | B2 * | 5/2012 | Lin et al. | 438/107 |
| 8,310,058 | B2 * | 11/2012 | Lin et al. | 257/774 |
| 2008/0023780 | A1 | 1/2008 | Jung et al. | |

* cited by examiner

*Primary Examiner* — Quoc Hoang
(74) *Attorney, Agent, or Firm* — Robert D. Atkins; Patent Law Group: Atkins & Associates, P.C.

(57) ABSTRACT

A semiconductor wafer contains a substrate having a plurality of active devices formed thereon. An analog circuit is formed on the substrate. The analog circuit can be an inductor, metal-insulator-metal capacitor, or resistor. The inductor is made with copper. A through substrate via (TSV) is formed in the substrate. A conductive material is deposited in the TSV in electrical contact with the analog circuit. An under bump metallization layer is formed on a backside of the substrate in electrical contact with the TSV. A solder material is deposited on the UBM layer. The solder material is reflowed to form a solder bump. A wire bond is formed on a top surface of the substrate. A redistribution layer is formed between the TSV and UBM. The analog circuit electrically connects through the TSV to the solder bump on the back side of the substrate.

24 Claims, 8 Drawing Sheets

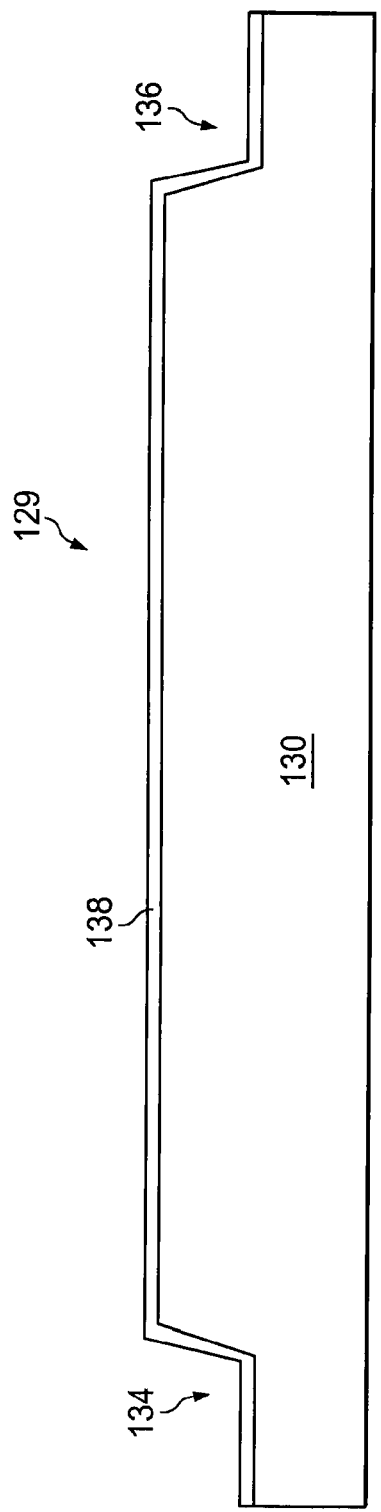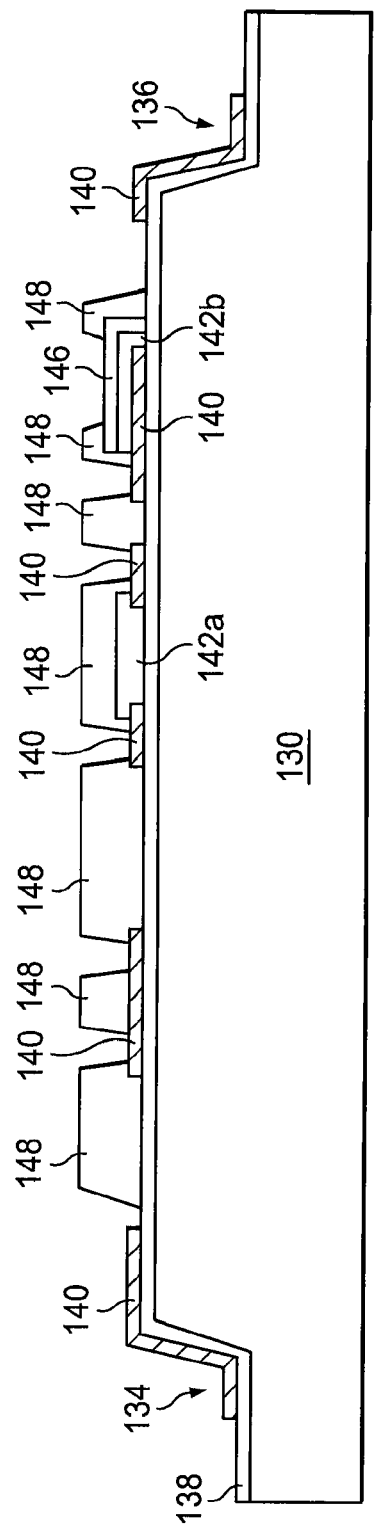

SEMICONDUCTOR DEVICE AND METHOD FOR FORMING PASSIVE CIRCUIT ELEMENTS WITH THROUGH SILICON VIAS TO BACKSIDE INTERCONNECT STRUCTURES

CLAIM TO DOMESTIC PRIORITY

The present application is a continuation of U.S. patent application Ser. No. 12/704,366, now U.S. Pat. No. 8,310, 058, filed Feb. 11, 2010, which is a division of U.S. patent application Ser. No. 11/947,617, filed Nov. 29, 2007, now U.S. Pat. No. 7,691,747, which applications are incorporated herein by reference.

FIELD OF THE INVENTION

The present invention relates in general to semiconductor devices and, more particularly, to a semiconductor device with integrated passive circuit elements interconnected to backside solder bumps.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to form passive circuit elements, including inductors, resistors, and capacitors, on the semiconductor wafer. The inductor and capacitor allows the IC to perform reactive circuit functions without using external circuit components. The passive circuit elements, particularly inductors, occupy significant area on the die. The inductors are typically formed as coiled or wound metal layers on the surface of the substrate which consumes a large area. The die must also accommodate interconnect structures, such as solder bumps, which also occupy significant space. The demand for smaller die with high feature density is challenging to achieve when taking into account the interconnect requirements.

A need exists to integrate passive circuit elements and interconnect structures with the demand for smaller and denser semiconductor die.

SUMMARY OF THE INVENTION

In one embodiment, the present invention is a method of making a semiconductor device comprising the steps of providing a substrate, forming a conductive via partially through a surface of the substrate to a depth less than a thickness of the substrate, forming an IPD over the substrate, and removing a portion the substrate opposite the IPD to expose the conductive via.

In another embodiment, the present invention is a method of making a semiconductor device comprising the steps of providing a substrate, forming an interconnect structure partially through the substrate, forming an IPD over the substrate, and removing a portion the substrate to expose the interconnect structure.

In another embodiment, the present invention is a method of making a semiconductor device comprising the steps of providing a substrate, forming an interconnect structure partially through the substrate, and forming an IPD over the substrate.

In another embodiment, the present invention is a semiconductor device comprising a substrate and interconnect structure formed partially through the substrate. An IPD is formed over the substrate.

BRIEF DESCRIPTION OF THE DRAWINGS

FIGS. 6a-6e illustrate an alternate process of forming passive circuit elements with through silicon vias to backside solder bumps on the semiconductor package.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
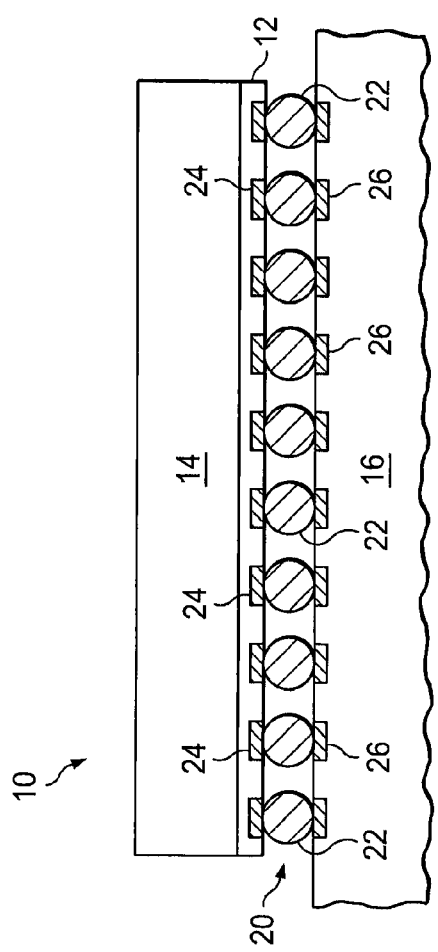
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive device formed within active area 12 and electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2A:
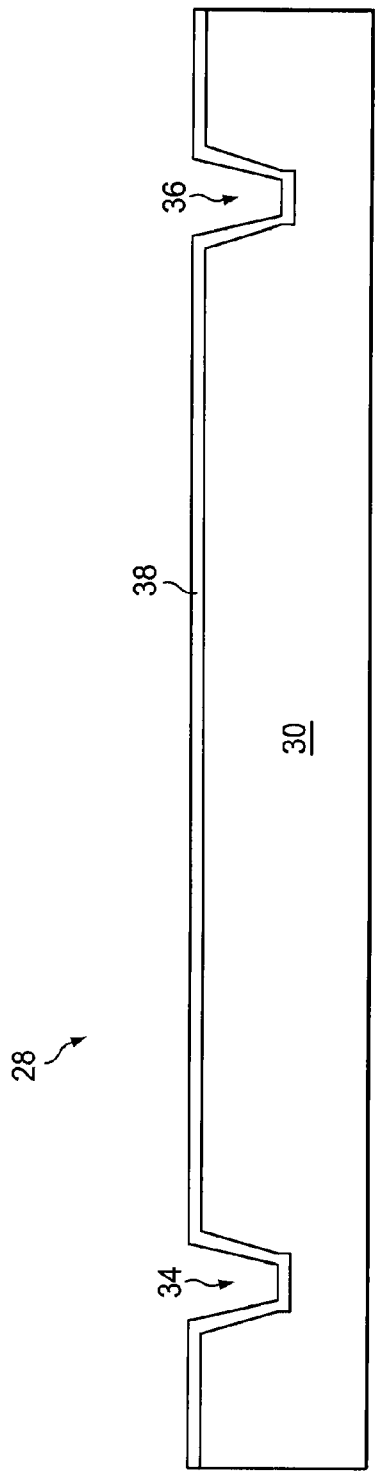
FIGS. 2a-2f illustrate a process of forming passive circuit elements with through silicon vias to backside solder bumps on the semiconductor package.

FIG. 2a illustrates semiconductor wafer 28 having a substrate 30 made of silicon or other bulk semiconductor material. Trenches or vias 34 and 36 are cut into substrate 30 using a deep reactive ion etch (DRIE) process or silicon wet etching with potassium hydroxide (KOH) process. Trenches 34 and 36 will become through substrate vias (TSV) in later stages. An insulating layer 38 is deposited by chemical vapor deposition (CVD) over substrate 30. The insulating layer 38 follows the contour of the substrate and provides a via liner for trenches 34 and 36. The insulating layer 38 can be made with silicon dioxide (SiO2), silicon oxynitride (SiON), silicon nitride (SixNy), tantalum pentoxide (Ta2O5), zirconium (Zr) oxide, or other material having dielectric properties. The thickness of insulating layer 38 ranges from 500 angstroms (Å) to 30 micrometers (μm) with a typical value of about 1000 Å.

Figure 2B:
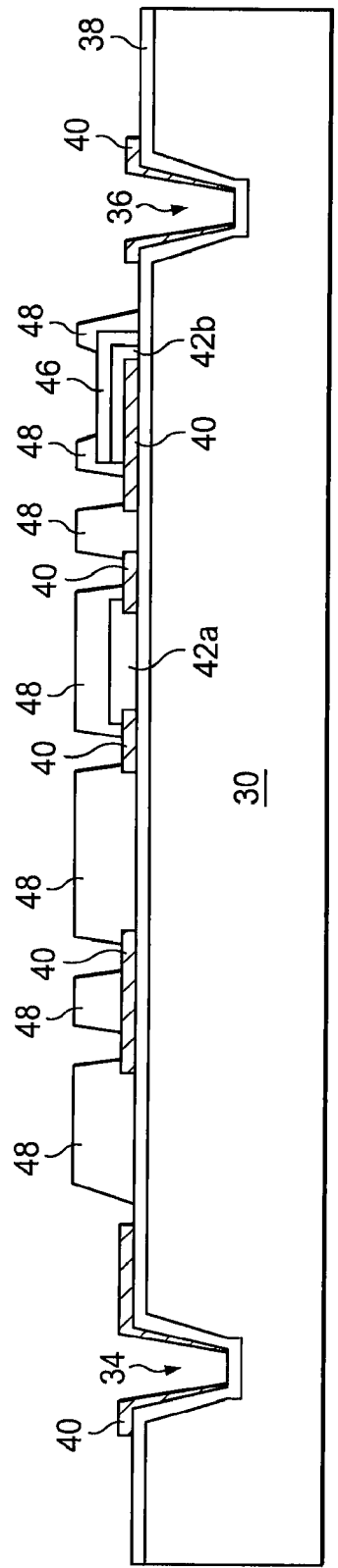

In FIG. 2b, an electrically conductive layer 40 is deposited and patterned on insulating layer 38. Conductive layer 40 can be made with aluminum (Al), Al alloy, copper (Cu), nickel (Ni), gold (Au), silver (Ag), or other electrically conductive material. Cu is typically used in conjunction with an adhesion layer and barrier layer. Conductive layer 40 can have multiple layers such as titanium (Ti)/titanium nitride (TiN)/Al/TiN. The deposition of conductive layer 40 uses a physical vapor deposition (PVD), CVD, evaporation, electrolytic plating, or electroless plating process. The conductive layers 40 can be electrically common or electrically isolated depending on the connectivity of the individual devices formed on substrate 30. The pattern of conductive layer 40 in vias 34 and 36 is optional.

A resistive layer 42, noted as resistive layers 42a and 42b, is deposited and patterned on insulating layer 38 and connected to conductive layer 40 to form a resistor. Alternatively, resistive layer 42 can be connected through plating layer 50 and Cu layer 54 to form a resistor, see FIG. 2c. Resistive layer 42b is patterned between conductive layer 40 and insulating layer 46 to suppress the Hillock growth. Resistive layer 42 is made with silicide, doped poly silicon, tantalum nitride (TaN), nickel chromium (NiCr), or TiN having a sheet resistivity up to about 100 ohm/square. The deposition of resistive layer 42 may involve PVD or CVD with a thickness ranging from 200-5000 Å.

An insulating layer 46 is deposited and patterned on resistive layer 42b. The insulating layer 46 may cover other circuit regions for insulation purposes. The insulating layer 46 can be made with SiO2, SixNy, SiON, Ta2O5, Zr oxide, or other dielectric material. The deposition of insulating layer 46 may involve PVD or CVD.

A passivation layer 48 is formed over the structure created in FIGS. 2a-2b for structural support and electrical isolation. Passivation layer 48 can be made with SiO2, SixNy, SiON, polyimide (PI), benzocyclobutene (BCB), polybenzoxazole (PBO), or other insulating material. A portion of passivation layer 48 is removed using a mask-defined photolithography process to expose conductive layers 40 and insulating layers 38 and 46.

Figure 2C:
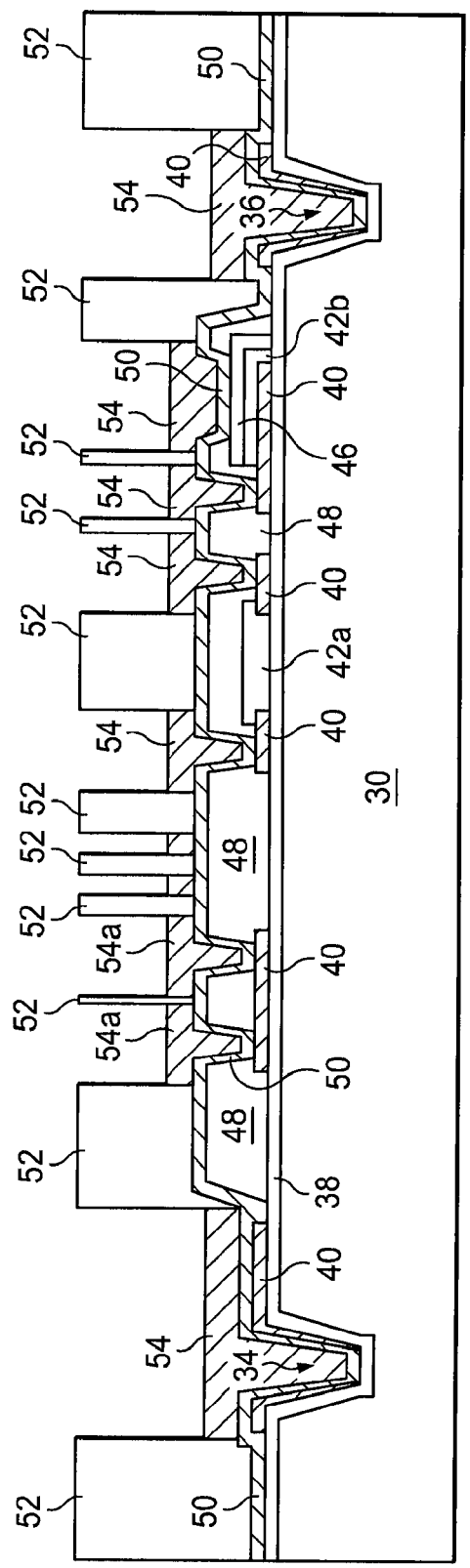

In FIG. 2c, a metal plating layer 50, e.g. Cu plating, is deposited. The plating layer 50 has an adhesion layer and seed layer. The adhesion layer can be made with Ti, TiW, Ta/TaN, or Cr. The seed layer is typically Cu. A layer of photoresist 52 is patterned over plating layer 50 for Cu layer 54. Cu layer 54 can be deposited as a conformal coating over trenches 34 and 36. Alternatively, Cu layer 54 can be a via fill process which deposits Cu into vias 34 and 36. Cu layer 54 can be used to form interconnection as well as inductor wings or transmission lines. The inductor wings are formed together with TSV metal deposition through Cu plating. The Cu material in trenches 34 and 36 can be formed at the same time as Cu layer 54 and 54a on passivation layer 48. Alternately, a dual plating of the Cu layers fills trenches 34 and 36 and forms Cu layer 54a at different times. The optional conductive layer 40 in vias 34 and 36 improves metal step coverage and Cu fill process in the vias. Cu layers 54 can be electrically common or electrically isolated depending on the connectivity of the individual devices formed on substrate 30.

Figure 2D:
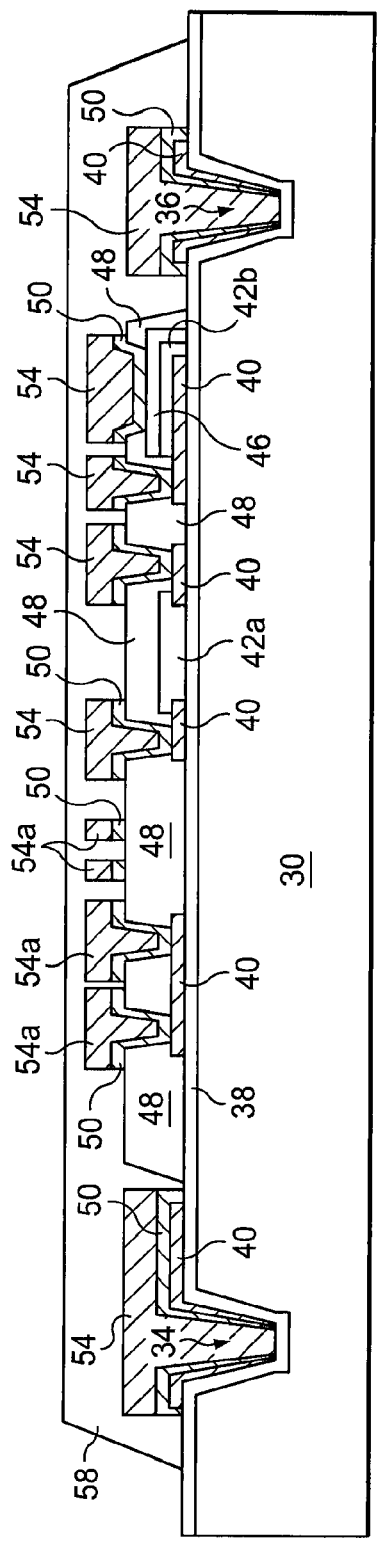

In FIG. 2d, photoresist 52 is removed. A portion of plating layer 50 is removed by etching. Passivation layer 58 is coated over the structure formed in FIGS. 2a-2c for structural support and electrical isolation. Passivation layer 58 can be made with SiO2, SixNy, SiON, PI, BCB, PBO, epoxy, or other insulating material.

Figure 2E:
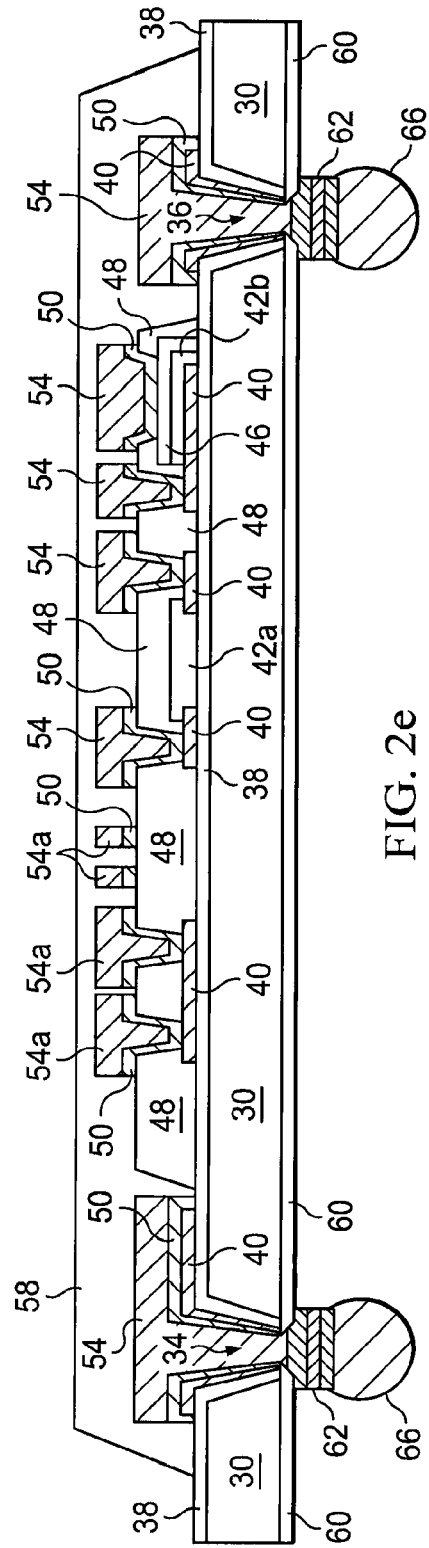

In FIG. 2e, semiconductor wafer 28 is back grinded to expose TSV 34 and 36. Accordingly, conductive vias 34 and 36 pass through silicon substrate 30. A passivation layer 60 is deposited and patterned on the backside of semiconductor wafer 28. Passivation layer 60 can be made with SiO2, SixNy, SiON, PI, BCB, PBO, epoxy, or other insulating material. An under bump metallization (UBM) 62 is deposited and patterned to electrically contact Cu layer 54 in TSV 34 and 36. UBMs 62 can be made with Ti, Ni, NiV, Cu, or Cu alloy. UBMs 62 can be a multiple metal stack with adhesion layer, barrier layer, and wetting layer. The adhesion layer is made with Ti, Cr, Al, TiW, or titanium nitride (TiN). The barrier layer can be made with Ni, NiV, CrCu, or TiW. The wetting layer can be made with Cu, Au, or Ag. The exposed TSV 34 and 36 can be used for alignment of UBMs 62. Alternatively, a back side alignment (BSA) infrared (IR) alignment can be used to form UBMs 62.

An electrically conductive solder material is deposited over UBMs 62 through an evaporation, electrolytic plating, electroless plating, ball drop, or screen printing process. The solder material can be any metal alloy or electrically conductive material, e.g., Sn, lead (Pb), Ni, Au, Ag, Cu, bismuthinite (Bi), and alloys thereof. The solder material is typically lead-free such as Sn96.5Ag3.5. The solder material is reflowed by heating the conductive material above its melting point to form spherical balls or bumps 66. In some applications, solder bumps 66 are reflowed a second time to improve electrical contact to UBMs 62. UBMs 62 and solder bumps 66 represent one type of interconnect structure.

Figure 2F:
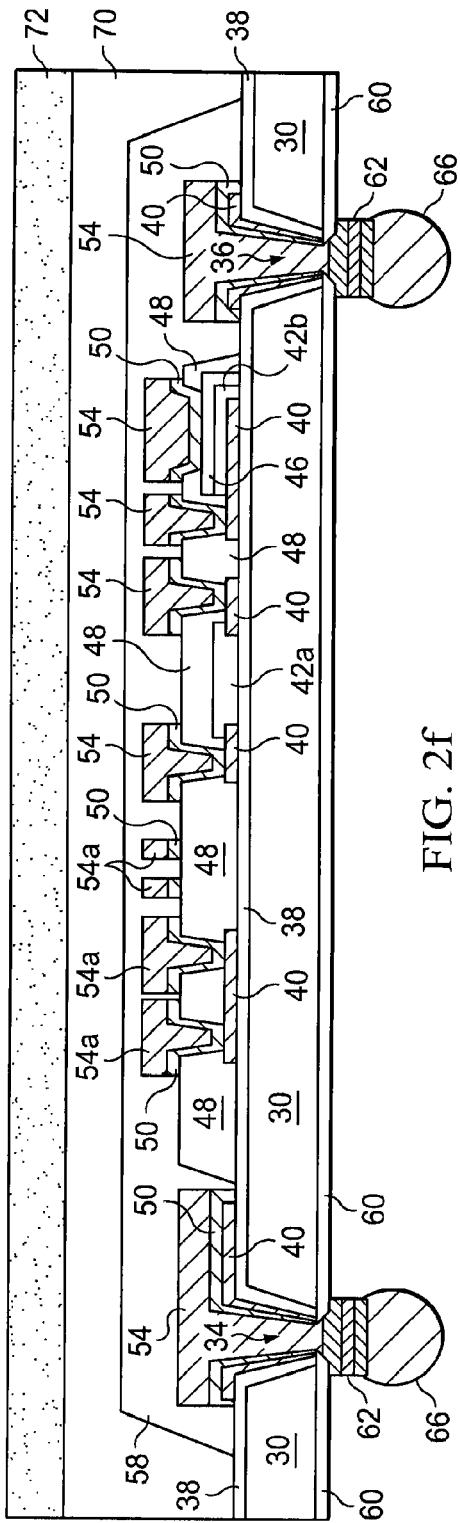

In FIG. 2f, an optional polymer glue layer 70 is applied over passivation layer 58. Chip carrier 72 is bonded to semiconductor wafer 28 with polymer glue layer 70. Alternatively, backgrinding tape or permanent molding compound is applied without carrier 72. When permanent molding compound is applied, passivation layer 58 can be optional. The backgrinding tape or polymer glue with carrier 72 is removed before or after dicing. Alternatively, the glue and carrier may remain permanently attached and become part of the die.

The passive circuit elements, such as resistors, inductors, and capacitors, occupy a significant portion of the limited space on the surface of substrate 30. The interconnect structures like UBMs 62 and solder bumps 66 are disposed on the backside of the die. Semiconductor package 68 uses many TSVs like 34 and 36 to electrically connect the passive circuit elements on the topside of the die through UBMs 62 to solder bumps 66 on the backside of the die to provide for greater use of die area and improve reliability.

The semiconductor device in FIG. 2e has a number of passive circuit elements. Cu layer 54a represents a cross-sectional view of an inductor coiled on the surface of substrate 30. The inductor is formed as coiled or wound metal layers on the surface of the substrate. The conductive layers 40 and Cu layers 54 can be electrically common or electrically isolated to connect the passive circuit elements according to the desired circuit function. For example, the portion of CU layer 54 overlying TSVs 34 and 36 can electrically contact Cu layer 54a to connect both ends of the inductor formed by Cu layer 54a through UBMs 62 to solder bumps 66 under TSVs 34 and 36, respectively.

In a similar manner, the resistive layer 42a also provides a passive circuit element, i.e., a resistor connected between conductive layers 40. The portion of Cu layers 54 overlying conductive layers 40 between resistive layer 42a can electrically contact Cu layers 54 overlying TSVs 34 and 36 to connect both ends of the resistor formed by resistive layer 42a through UBMs 62 to solder bumps 66 under TSV 34 and 36, respectively.

In another example, the combination of conductive layer 40, resistive layer 42b, insulating layer 46, conductive layer 50, and Cu layer 54 constitute a passive circuit, i.e., a resistor in series with a metal-insulator-metal (MIM) capacitor. The portion of Cu layer 54 in contact with conductive layer 40 under resistive layer 42b can electrically contact Cu layer 54 overlying TSV 34. The portion of Cu layer 54 overlying insulating layer 46 can electrically contact Cu layer 54 overlying TSV 36.

Accordingly, TSVs 34 and 36 allow the passive circuit elements to be placed on the topside of the die and to be electrically connected to the interconnect structures, which are disposed on the backside of the die. The placement of passive circuit elements on the topside of substrate 30 and the interconnect structures on the backside of substrate 30 provides for greater use of die area and improves reliability. The TSVs provide for electrical connection between the topside passive circuit elements and the backside interconnect structures. The inductor and MIM capacitor allow the semiconductor device to perform reactive circuit functions without using external circuit components.

Figure 3:
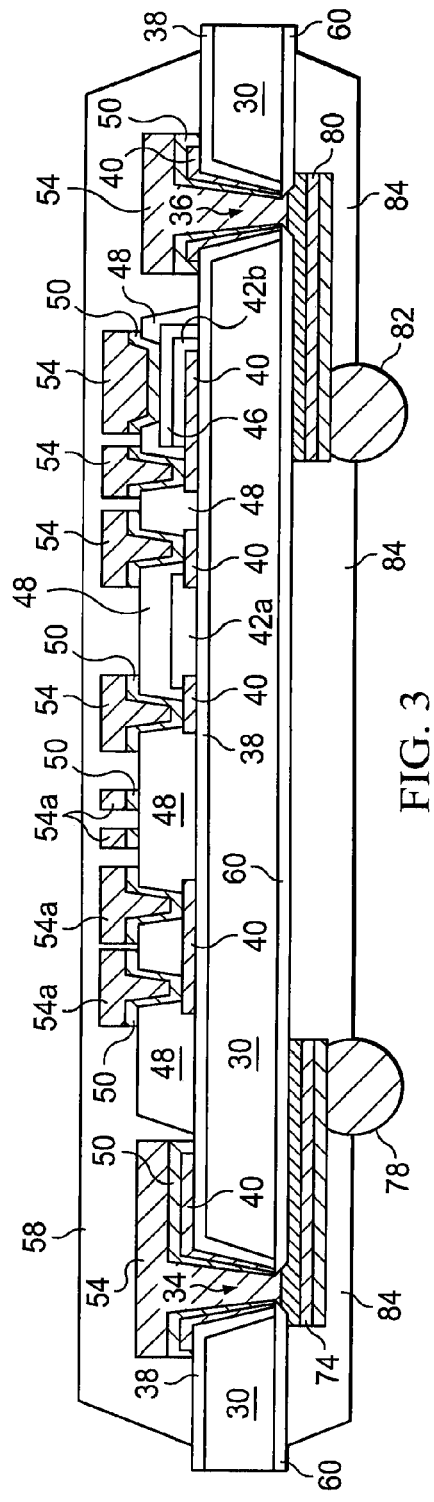
FIG. 3 illustrates a semiconductor package with passive circuit elements and backside RDL to solder bumps.

FIG. 3 illustrates an alternate embodiment of the semiconductor package. Redistribution layers (RDL) 74 and 80 are formed over passivation layer 60. In one embodiment, RDLs 74 and 80 may include a wetting layer, barrier layer, and adhesive layer. RDLs 74 and 80 provide electrical contact between the Cu material in TSV 34 and solder bumps 78 and 82, respectively. RDLs 74 and 80 can be made with Al, aluminum copper alloy (AlCu), Cu, or Cu alloy with an adhesion and barrier layers. The adhesion layer can be Ti, TiN, TiW, Cr, or Ta. The barrier layer can be NiV, TaN, TiW, or CrCu. RDLs 74 and 80 operate as an intermediate conduction layer to route electrical signals from solder bumps 78 and 82 to various areas of the die, including active and passive circuits, and provides various electrical interconnect options during integration of semiconductor package 86. RDLs 74 and 80 provide routing options to relocate solder bumps 78 and 82 away from TSV 34 and 36. A passivation layer 84 is formed over RDLs 74 and 80 and passivation layer 60.

Figure 4:
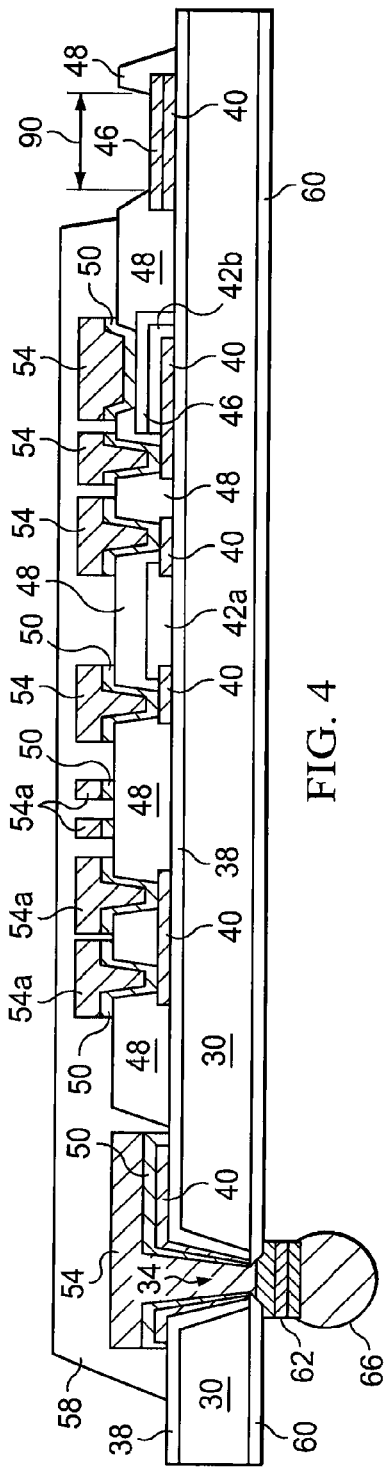
FIG. 4 illustrates a semiconductor package with passive circuit elements interconnected to topside wire bond pads and through silicon vias to backside solder bumps.

FIG. 4 illustrates an alternate embodiment of the semiconductor package. A TSV 34 is formed on the left side of the semiconductor package using the steps described in FIGS. 2a-2f. A wire bonding pad 90 is formed on the right side of semiconductor package.

Figure 5:
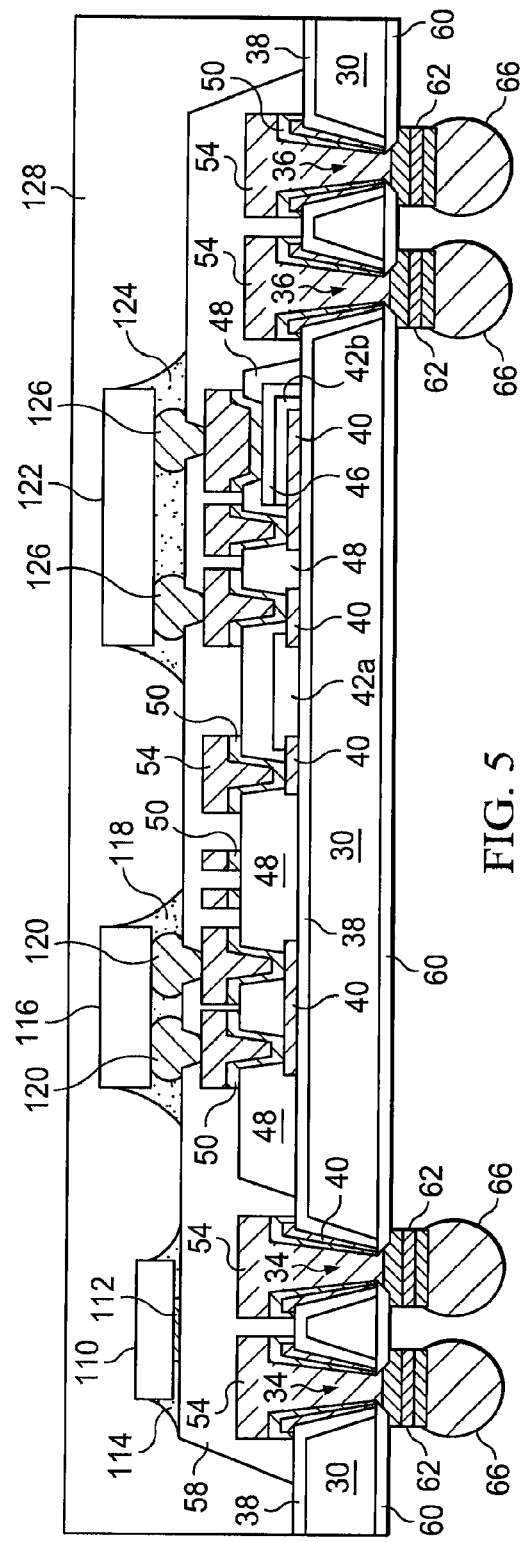
FIG. 5 illustrates a semiconductor package with passive circuit elements interconnected to other semiconductor packages.

FIG. 5 illustrates another embodiment of the semiconductor package. In this embodiment, multiple TSVs 34 and 36 and solder bumps 66 are provided on both ends of the semiconductor package. Passive devices and/or analog circuits 110 are mounted on passivation layer 58 with underfill material 114 and are electrically connected by contact pad 112. Semiconductor die 116 is mounted to passivation layer 58 with underfill material 118 and is electrically connected to Cu layers 54 with solder bumps 120. Semiconductor die 122 is mounted to passivation layer 58 with underfill material 124 and is electrically connected to Cu layers 54 with solder bumps 126. Molding compound 128 or other composite polymer materials with proper coefficient of thermal expansion (CTE) is deposited over the structures formed on FIG. 5. Topside grinding may be used to get a flatter surface.

FIG. 6a illustrates semiconductor wafer 129 having a substrate 130 made of silicon or other bulk semiconductor material. Trenches or vias 134 and 136 are cut into substrate 130 using wet silicon etching process such as KOH. Trenches 134 and 136 will become TSVs in later stages. An insulating layer 138 is deposited by CVD over substrate 130, following the contour of the substrate and providing a via liner for trenches 134 and 136. The insulating layer 138 can be made with SiO2, SiON, SixNy, Ta2O5, ZrO, or other material having dielectric properties. The thickness of insulating layer 138 ranges from 500 Å to 30 μm with a typical thickness of about 1000 Å.

In FIG. 6b, an electrically conductive layer 140 is deposited and patterned on insulating layer 138. Conductive layer 140 can be made with Al, Al alloy, Ti/TiN/Al/TiN, Cu, Ni, Au, Ag, or other electrically conductive material. The pattern of conductive layer 140 in vias 134 and 136 is optional. The deposition of conductive layer 140 uses a PVD, CVD, evaporation, electrolytic plating, electroless plating, or screen printing process. The conductive layers 140 can be electrically common or electrically isolated depending on the connectivity of the individual devices formed on substrate 130.

A resistive layer 142, noted as resistive layers 142a and 142b, is deposited and patterned on insulating layer 138 and conductive layer 140. Resistive layer 142 is made with silicide, doped poly Si, TaN, or NiCr having a resistivity up to about 100 ohm/square. The deposition of resistive layer 142 may involve PVD or CVD.

An insulating layer 146 is patterned and deposited on resistive layer 142b. The insulating layer 146 can be made with SiO2, SixNy, SiON, Ta2O5, Zr2O5, or other dielectric material. The deposition of insulating layer 146 may involve PVD or CVD with typical thickness of 200-4000 Å.

A passivation layer 148 is formed over the structure created in FIGS. 6a-6b for structural support and electrical isolation. Passivation layer 148 can be made with SiO2, SixNy, SiON, PI, BCB, PBO, or other insulating material. A portion of passivation layer 148 is removed using a mask-defined photolithography process to expose conductive layers 140 and insulating layers 138 and 146.

Figure 6C:
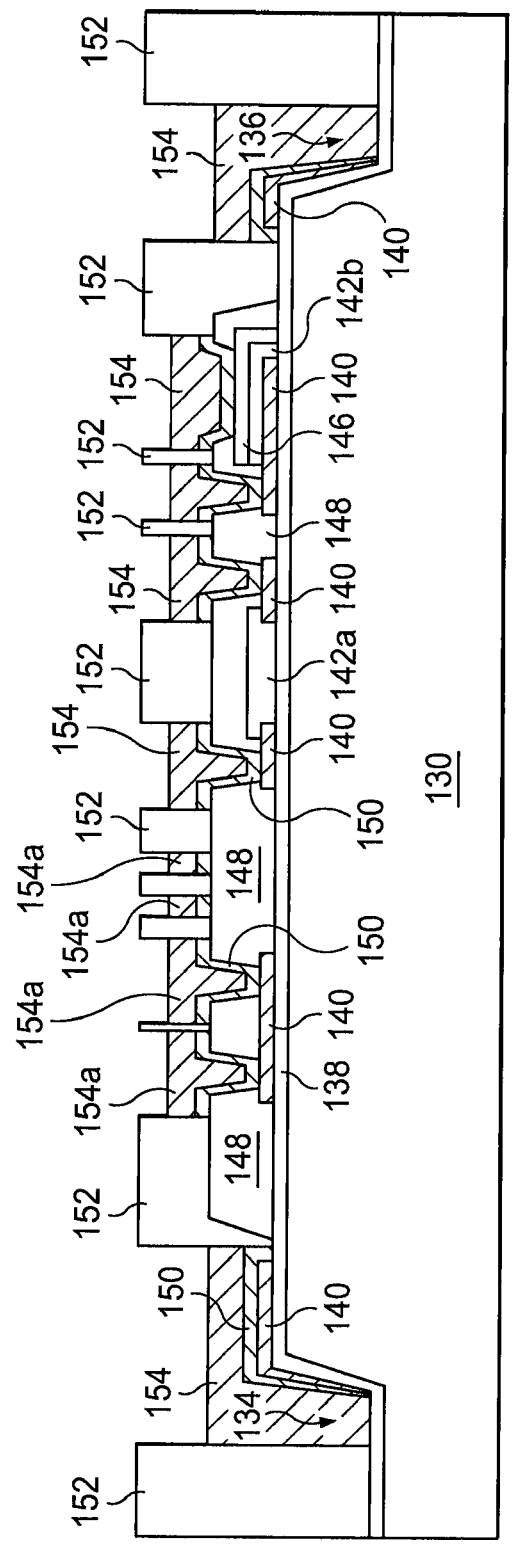

In FIG. 6c, a metal plating 150, e.g. Cu plating, is deposited and patterned with thick photo resist 152. The plating layer 150 has an adhesion layer and seed layer. The adhesion layer can be made with Ti, TiW, Ta/TaN, or Cr. The seed layer is typically Cu. A layer of photoresist 152 patterns plating layer 150 for Cu layer 154. Cu layer 154 can also be deposited as a conformal coating over trenches 134 and 136. Alternatively, Cu layer 154 can be formed via a fill process which deposits Cu into vias 134 and 136. Cu layer 154 can be used to form interconnection as well as inductor wings or transmission lines. The inductor wings are formed together with TSV metal deposition through Cu plating. The Cu layer 154 is a conductive material deposited in trenches 134 and 136 as well as other locations on the surface of substrate 130 to form conductive layers and passive devices or analog circuits. The Cu material in trenches 134 and 136 can be formed at the same time as Cu layer 154 and 154a on passivation layer 148. Alternately, a dual plating of the Cu layers fills trenches 134 and 136 and forms Cu layer 154a at different times. The Cu plating rate in trenches 134 and 136 improves with conductive layer 140. Cu layers 154 can be electrically common or electrically isolated depending on the connectivity of the individual devices formed on substrate 130.

Figure 6D:
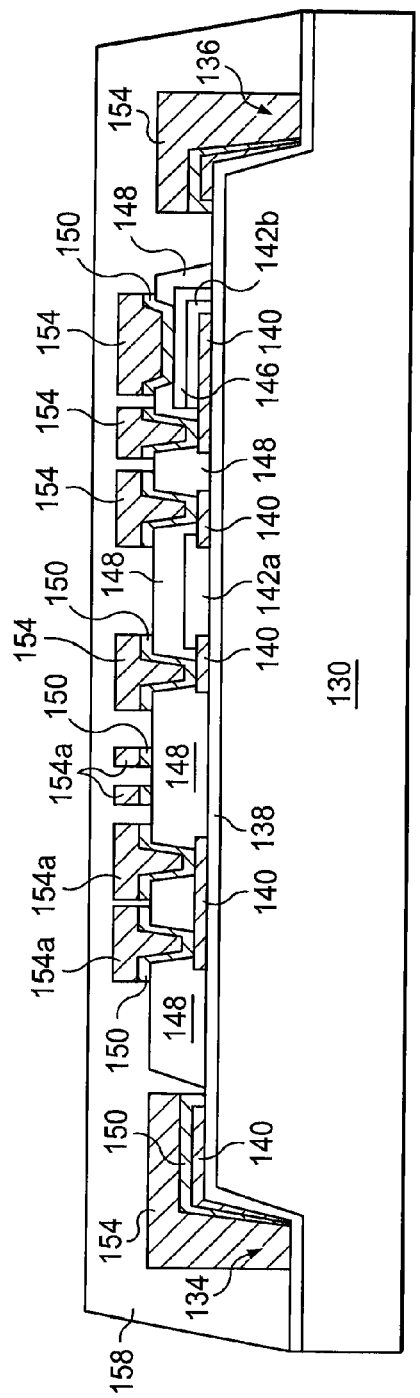

In FIG. 6d, photoresist 152 is removed. A portion of Cu plating layer 150 is removed by etching. Passivation layer 158 is coated over the structure formed in FIGS. 6a-6c for structural support and electrical isolation. Passivation layer 158 can be made with SiO2, SixNy, SiON, PI, BCB, PBO, or other insulating material.

Figure 6E:
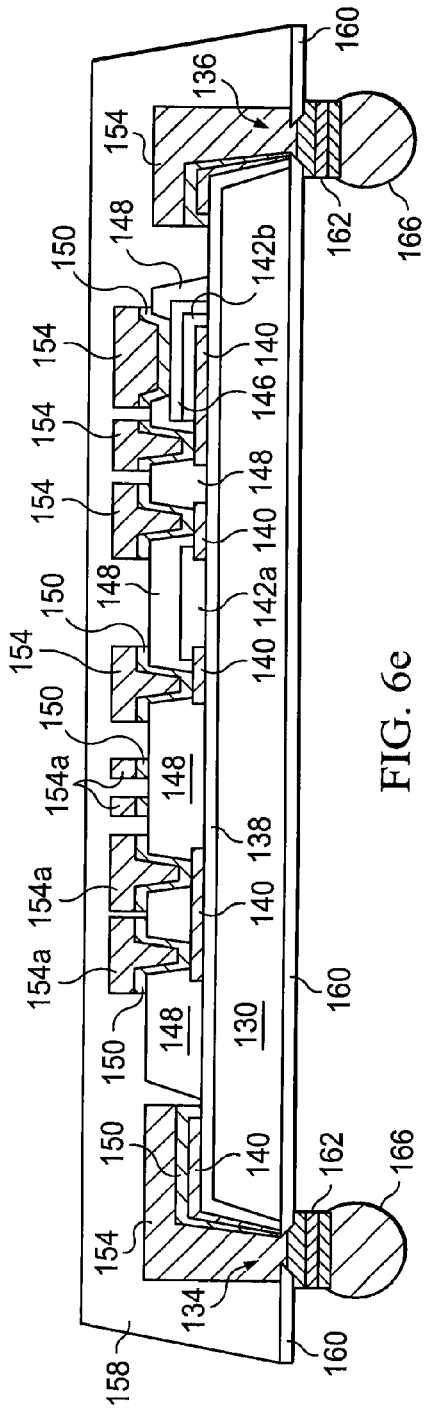

In FIG. 6e, semiconductor wafer 170 is back grinded to expose TSV 134 and 136. Accordingly, conductive vias 134 and 136 pass through silicon substrate 130. A passivation layer 160 is deposited and patterned on the backside of semiconductor wafer 170. Passivation layer 160 can be made with SiO2, SixNy, SiON, PI, BCB, PBO, epoxy, or other insulating material. A UBM 162 is deposited and patterned to electrically contact Cu layer 154 in TSV 134 and 136. UBMs 162 can be made with Ti, Ni, NiV, Cu, or Cu alloy. UBMs 162 can be a multiple metal stack with adhesion layer, barrier layer, and wetting layer. The adhesion layer is made with Ti, Cr, Al, TiW, or titanium nitride (TiN). The barrier layer can be made with Ni, NiV, CrCu, or TiW. The wetting layer can be made with Cu, Au, or Ag. The exposed TSV 134 and 136 can be used for alignment of UBMs 162. Alternatively, a BSA/IR alignment can be used to form UBMs 162.

An electrically conductive solder material is deposited over UBMs 162 through an evaporation, electrolytic plating, electroless plating, ball drop, or screen printing process. The solder material can be any metal or metal alloy or electrically conductive material, e.g., Sn, Pb, Ni, Au, Ag, Cu, Bi, and alloys thereof. The solder material is reflowed by heating the conductive material above its melting point to form spherical balls or bumps 166. In some applications, solder bumps 166 are reflowed a second time to improve electrical contact to UBMs 162. UBMs 162 and solder bumps 166 represent one type of interconnect structure.

The passive circuit elements, such as resistors, inductors, and capacitors, occupy a significant portion of the limited space on the surface of substrate 130. The interconnect structures like UBMs 162 and solder bumps 166 are disposed on the backside of the die. Semiconductor package 170 uses many TSVs like 134 and 136 to electrically connect the passive circuit elements on the topside of the die through UBMs 162 to solder bumps 166 on the backside of the die to provide for greater use of the die area and improve reliability.

The semiconductor device in FIG. 6e has a number of passive circuit elements. Cu layer 154a represents a cross-sectional view of an inductor coiled on the surface of substrate 130. The inductor is formed as coiled or wound metal layers on the surface of the substrate. The conductive layers 140 and Cu layers 154 can be electrically common or electrically isolated to connect the passive circuit elements according to the desired circuit function. For example, the portion of CU layer 154 overlying TSVs 134 and 136 can electrically contact Cu layer 154a to connect both ends of the inductor formed by Cu layer 154a through UBMs 162 to solder bumps 166 under TSVs 134 and 136, respectively.

In a similar manner, the resistive layer 142a also provides a passive circuit element, i.e., a resistor connected between conductive layers 140. The portion of Cu layers 154 overlying conductive layers 140 between resistive layer 142a can electrically contact Cu layers 154 overlying TSVs 134 and 136 to connect both ends of the resistor formed by resistive layer 142a through UBMs 162 to solder bumps 166 under TSV 134 and 136, respectively.

In another example, the combination of conductive layer 140, resistive layer 142b, insulating layer 146, conductive layer 150, and Cu layer 154 constitute a passive circuit, i.e., a resistor in series with a MIM capacitor. The portion of Cu layer 154 in contact with conductive layer 140 under resistive layer 142b electrically contacts Cu layer 154 overlying TSV 134. The portion of Cu layer 154 overlying insulating layer 146 electrically contacts Cu layer 154 overlying TSV 136.

Accordingly, TSVs 134 and 136 allows the passive circuit elements to be placed on the topside of the die to be electrically connected to the interconnect structures, which are disposed on the backside of the die. The placement of passive circuit elements on the topside of substrate 130 and the interconnect structures on the backside of substrate 130 provides for greater use of die area and improves reliability. The TSVs provide for electrical connection between the topside passive circuit elements and the backside interconnect structures. The inductor and MIM capacitor allow the semiconductor device to perform reactive circuit functions without using external circuit components.

While one or more embodiments of the present invention have been illustrated in detail, the skilled artisan will appreciate that modifications and adaptations to those embodiments may be made without departing from the scope of the present invention as set forth in the following claims

What is claimed:

1. A method of making a semiconductor device, comprising:
   providing a substrate;
   forming a conductive via partially through a surface of the substrate to a depth less than a thickness of the substrate;
   forming an integrated passive device (IPD) over the substrate; and
   removing a portion of the substrate opposite the IPD to expose the conductive via.

2. The method of claim 1, further including depositing an encapsulant over the substrate and IPD.

3. The method of claim 1, wherein the IPD includes a resistor, capacitor, or inductor.

4. The method of claim 1, wherein forming the IPD includes:
   forming a first conductive layer over the substrate;
   forming an insulating layer over the first conductive layer; and
   forming a second conductive layer over the insulating layer.

5. The method of claim 1, wherein forming the IPD includes forming a conductive layer over the substrate and wound to exhibit an inductive property.

6. The method of claim 1, further including disposing a semiconductor die over the substrate.

7. A method of making a semiconductor device, comprising:
   providing a substrate including an interconnect structure disposed partially through the substrate;
   forming an integrated passive device (IPD) over a first surface of the substrate; and
   removing a portion of the substrate from a second surface of the substrate opposite the first surface to expose the interconnect structure.

8. The method of claim 7, further including depositing an encapsulant over the substrate and IPD.

9. The method of claim 7, further including disposing a semiconductor die over the substrate.

10. The method of claim 7, wherein the IPD includes a resistor, capacitor, or inductor.

11. The method of claim 7, further including:
   forming an under bump metallization (UBM) layer over a surface of the substrate and electrically connected to the interconnect structure; and
   forming a bump over the UBM layer.

12. The method of claim 7, wherein forming the interconnect structure includes:
   forming a via partially through the substrate; and
   forming a first conductive layer over a sidewall of the via.

13. The method of claim 12, wherein forming the interconnect structure further includes forming a second conductive layer over the first conductive layer.

14. A method of making a semiconductor device, comprising:
   providing a substrate including an interconnect structure disposed partially through the substrate; and
   disposing a first conductive layer over the substrate and into the interconnect structure to form a portion of an integrated passive device (IPD) over the substrate.

15. The method of claim 14, further including removing a portion of the substrate opposite the IPD to expose the interconnect structure.

16. The method of claim 14, further including depositing an encapsulant over the substrate and IPD.

17. The method of claim 14, further including disposing a semiconductor die over the substrate.

18. The method of claim 14, wherein the IPD includes a resistor, capacitor, or inductor.

19. The method of claim 14, further including:
   forming an under bump metallization (UBM) layer over a surface of the substrate and electrically connected to the interconnect structure; and
   forming a bump over the UBM layer.

20. The method of claim 14, wherein forming the interconnect structure includes:
   forming a via partially through the substrate;
   forming a second conductive layer over a sidewall of the via; and
   forming a third conductive layer over the second conductive layer.

21. A semiconductor device, comprising:
   a substrate including an interconnect structure formed partially through the substrate;
   a first conductive layer disposed in the interconnect structure; and
   a passive circuit element formed over the substrate.

22. The semiconductor device of claim 21, further including a semiconductor die disposed over the substrate.

23. The semiconductor device of claim 21, wherein the passive circuit element includes a resistor, capacitor, or inductor.

24. The semiconductor device of claim 21, wherein the interconnect structure includes:
   a via formed partially through the substrate;
   a second conductive layer formed over a sidewall of the via; and
   a third conductive layer formed over the second conductive layer.

* * * * *